(12) United States Patent
Tseng

(10) Patent No.: US 6,340,920 B1
(45) Date of Patent: Jan. 22, 2002

(54) LOW VOLTAGE LOW POWER CRYSTAL OSCILLATOR

(75) Inventor: Yuh-Kuang Tseng, Taoyuan Hsien (TW)

(73) Assignee: Industrial Technology Research, Hsinchu (TW)

( * ) Notice: Subject to any disclaimer, the term of this patent is extended or adjusted under 35 U.S.C. 154(b) by 0 days.

(21) Appl. No.: 09/548,033

(22) Filed: Apr. 12, 2000

(30) Foreign Application Priority Data

Feb. 23, 2000 (TW) ........................................... 89103130

(51) Int. Cl.[7] ................................................. H03B 5/06
(52) U.S. Cl. ............................ 331/116 FE; 331/116 R; 331/74; 331/183; 331/158
(58) Field of Search ............................. 331/116 FE, 74, 331/158, 116 R, 183

(56) References Cited

U.S. PATENT DOCUMENTS 4,282,496 A  *  8/1981  Heuner .................. 331/116 FE
5,486,795 A       1/1996  Spence et al. ......... 331/116 FE

* cited by examiner

Primary Examiner—Arnold Kinkead
(74) Attorney, Agent, or Firm—Darby & Darby

(57) ABSTRACT

An oscillator is provided with an inverter, a quartz crystal, a voltage source, an upper clamper, a ground node, a lower clamper, and a feedback-controlled switch. The inverter is connected in parallel to the quartz crystal having a crystal input and a crystal output. The upper damper is connected between the inverter and the voltage source. The lower damper is connected between the inverter and the ground node. The feedback-controlled switch has a pair of switch control nodes connected to the crystal input, a switch input connected to the crystal output, and a switch output connected to the upper damper and the lower clamper. The potential at the switch output is determined by voltage levels at the switch control nodes and the switch input in order to control the upper damper and the lower damper while oscillating.

4 Claims, 4 Drawing Sheets

LOW VOLTAGE LOW POWER CRYSTAL OSCILLATOR

BACKGROUND OF THE INVENTION

1. Field of the Invention

The present invention relates to a crystal oscillator. More particularly, the present invention relates to a low voltage crystal oscillator configured with low power dissipation.

2. Description of the Related Art

There is shown in FIG. 1, a conventional Pierce-type oscillator having an input terminal XTAL-in, an output terminal XTAL-out, and an inverter 10 disposed therebetween. The inverter 10 is connected in parallel to a quartz crystal XTAL and a resistor R. The conventional oscillator pads on an integrated circuit (not shown in the drawing) by the input terminal XTAL-in and the output terminal XTAL-out. The inverter 10 includes a P-channel MOS transistor P0 and an N-channel MOS transistor N0, both gates of which are connected to the input terminal XTAL-in. The P-channel transistor P0 is configured with a source connected to a voltage source Vdd, and a drain tied to the drain of the N-channel transistor N0 as the output terminal XTAL-out. The N-channel transistor N0 has its source connected to ground. For parallel resonance, an input capacitor Cin and an output capacitor Cout are provided at the input terminal XTAL-in and the output terminal XTAL-out, respectively.

Power dissipated by the oscillator is proportional to three factors: operating frequency, capacitances of the capacitor Cin and Cout, and $V^2$ where V denotes the voltage across the quartz crystal XTAL. For minimizing the power dissipation, major design concern focuses on the voltage across the quartz crystal XTAL because the operating frequency and the capacitances are established. However, voltage swing at the output terminal XTAL-out of the conventional oscillator is Vdd so that the a great amount of power is dissipated thereby.

U.S. Pat. No. 5,486,795 discloses a low power crystal oscillator, an improvement of the conventional Pierce-type oscillator as shown in FIG. 2. Such a low power crystal oscillator further includes a load device and a switch. The load device is constituted by a diode-connected N-channel MOS transistor N1, which is configured with a gate and a drain tied together to the voltage source Vdd, and a source connected to the source of the P-channel transistor P0. The switch can be a P-channel MOS transistor P1 configured with a source connected to voltage source Vdd, a drain connected to the source of the P-channel transistor P0. The voltage at the gate of the transistor P1 is set to "0" on powering up, and set from "0" to "1" by a delay device D1 after a period of time is elapsed.

The improved crystal oscillator further includes a clamping device and another switch. The clamping device is constituted by a diode-connected P-channel MOS transistor P2, which is configured with a gate and a drain tied together to the ground, and a source connected to the source of the N-channel transistor N0. The other switch can be an N-channel MOS transistor N2 configured with a source connected to the ground, a drain connected to the source of the N-channel transistor N0. The voltage at the gate of the transistor N2 is set to "1" on powering on, and set from "1" to "0" by a delay device D2 after a predetermined time is elapsed.

As above, the N-channel transistor N1 and the P-channel transistor P2 are diode-connected transistors for providing predetermined voltage drop, Vtn and |Vtp|, respectively. Thus, the voltage swing at the output terminal of the quartz crystal XTAL can be decreased to about Vdd-|Vtp|-Vtn and thus power dissipation can be reduced. However, because the load device and the clamping device is implemented by means of diode-connected transistor each having a constant voltage drop of about 0.6V~0.7V. the voltage difference between nodes D and E remains at about 0.4V so that AC voltage gain is decreased when Vdd is about 1.8V. Therefore, such oscillators are not suitable for low voltage operation.

The same approach by diminishing the voltage swing at the output terminal of the quartz crystal to decrease power dissipation is also disclosed in U.S. Pat. No. 5,545,941, and thus encounters the same issues.

SUMMARY OF THE INVENTION

Therefore, it is an object of the present invention to provide a low voltage crystal oscillator which is configured with low power dissipation.

For attaining the above-identified object, the present invention provides an oscillator having an inverter, a quartz crystal, a voltage source, an upper clamper, a ground node, a lower clamper, and a feedback-controlled switch. The inverter are connected in parallel to the quartz crystal having a crystal input and a crystal output. The upper clamper is connected between the inverter and the voltage source. The lower clamper is connected between the inverter and the ground node. The feedback-controlled switch has a pair of switch control nodes connected to the crystal input, a switch input connected to the crystal output, and a switch output connected to the upper clamper and the lower clamper. The potential at the switch output is determined by voltage levels at the switch control nodes and the switch input in order to control the upper clamper and the lower damper while oscillating.

BRIEF DESCRIPTION OF DRAWING

The following detailed description, given by way of examples and not intended to limit the invention to the embodiments described herein, will best be understood in conjunction with the accompanying drawings, in which.

DETAILED DESCRIPTION OF THE INVENTION

According to the present invention, a low power oscillator, which is suitable for low voltage operation, is provided. The oscillator employs a feedback-controlled switch for controlling voltage swing at the output terminal of quartz crystal for the purposes of low voltage operation and low power dissipation.

Figure 1:
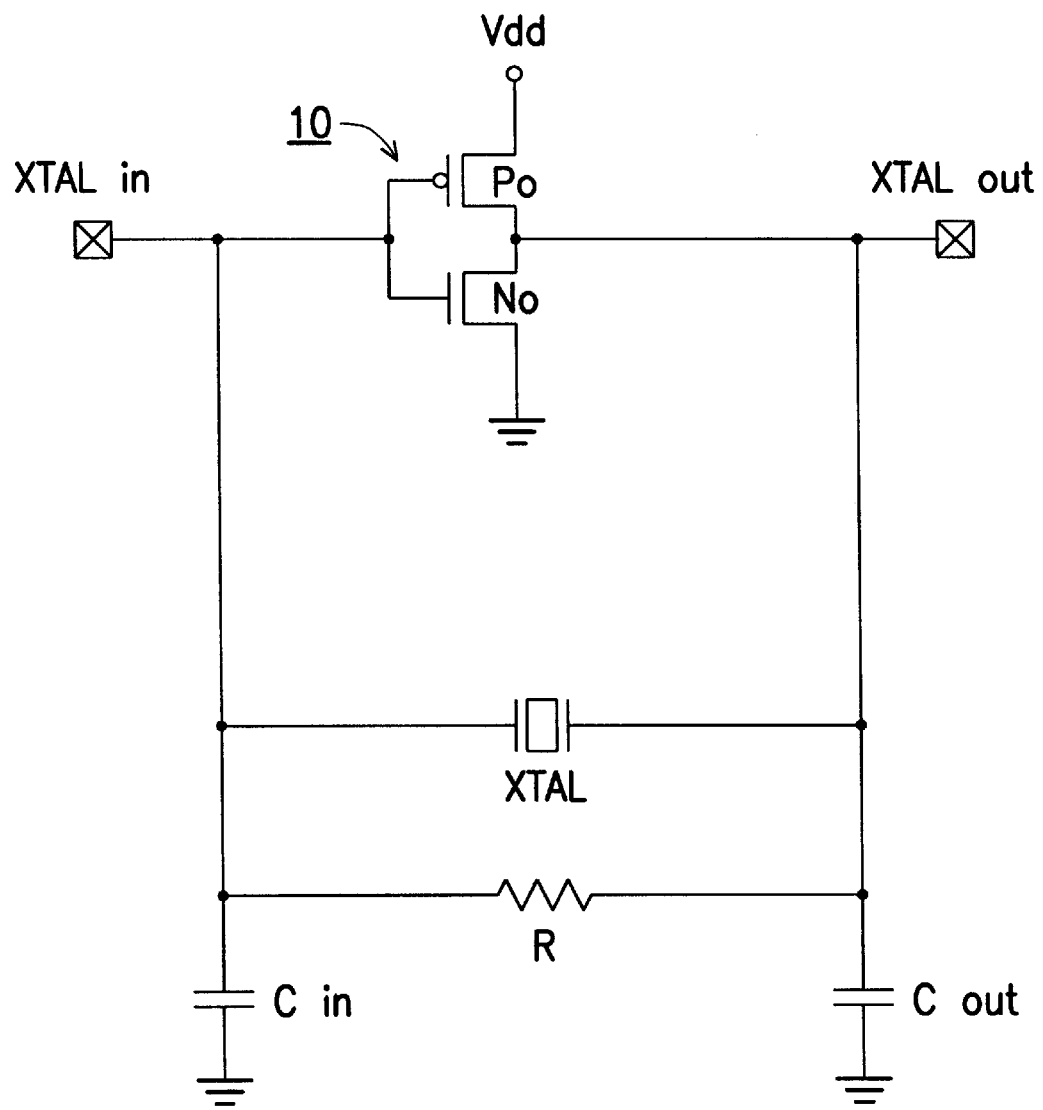
FIG. 1 schematically depicts a circuit diagram of a conventional Pierce-type oscillator.
Figure 2:
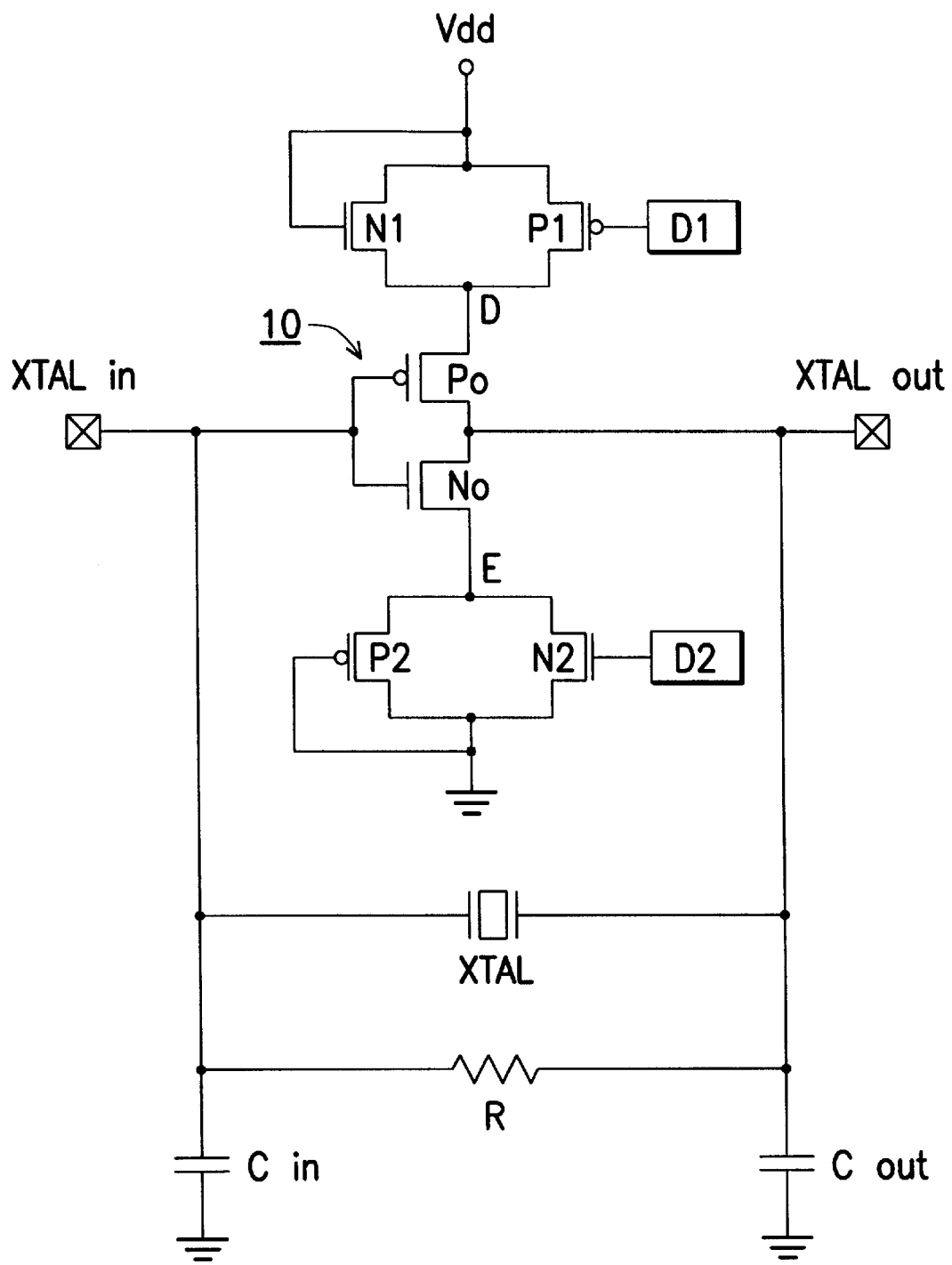
FIG. 2 schematically depicts a circuit diagram of the other conventional oscillator.
Figure 3:
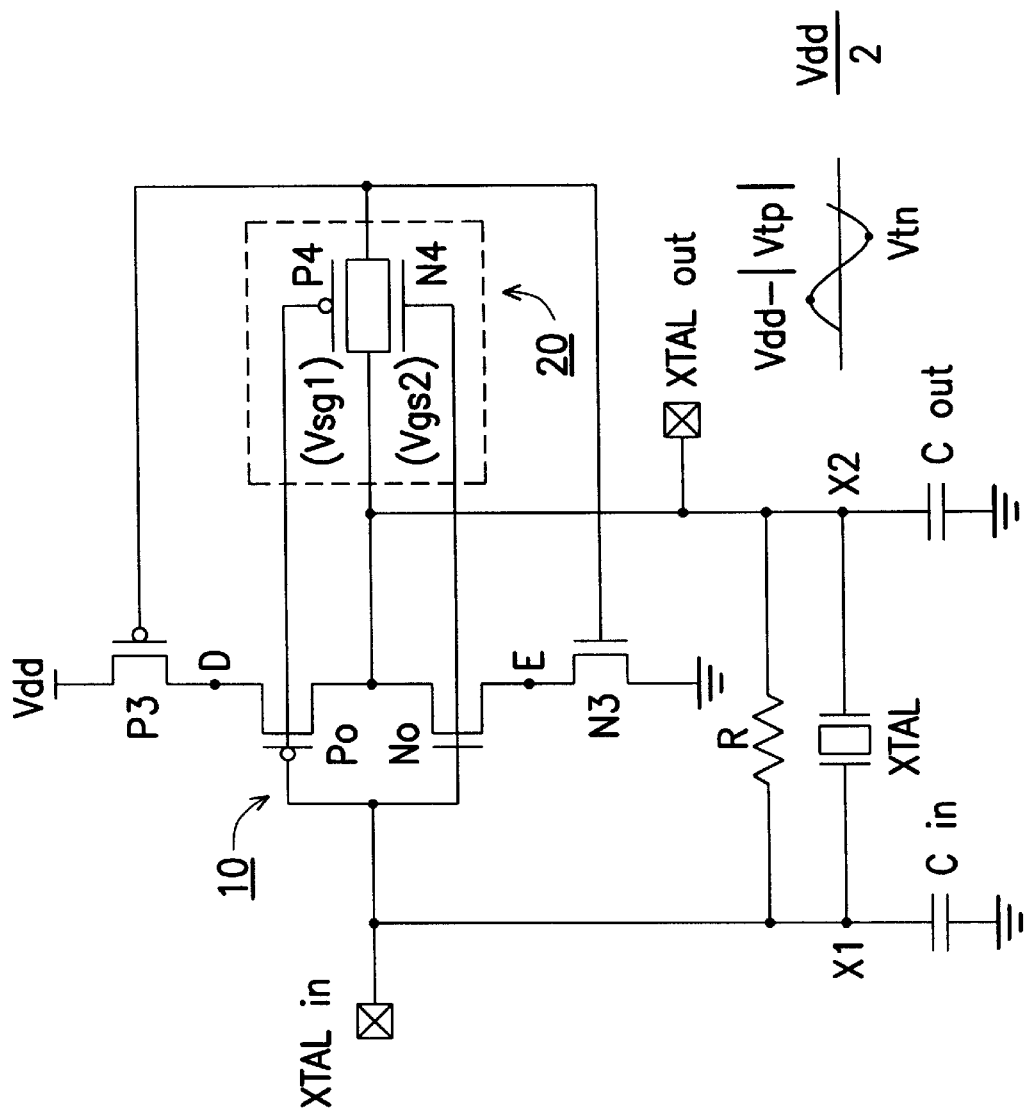
FIG. 3 schematically depicts a circuit diagram of a low voltage oscillator in accordance with one preferred embodiment of the present invention.

With reference to FIG. 3, a circuit diagram of the low power oscillator in accordance with one preferred embodiment of the present invention is schematically illustrated. In the drawing, the same reference numerals are given for the same or similar elements as those depicted in FIG. 1 and FIG. 2, where threshold voltages of N-channel transistor and P-channel transistor are designated as Vtn and −Vtp, respectively.

The oscillator of the present embodiment includes an inverter 10, a quartz crystal XTAL connected in parallel to the inverter 10, a voltage source Vdd, a ground node, an upper clamper, a lower clamper, and a feedback-controlled switch. The feedback-controlled switch can be a CMOS transmission gate 20 having a P-channel transistor P4 and an N-channel transistor N4. The feedback-controlled switch is provided with a pair of switch control terminals connected to an input terminal X1 of the quartz crystal XTAL, a switch input terminal connected to an output terminal X2 of the quartz crystal XTAL, and a switch output terminal connected to the upper clamper and the lower clamper. The upper clamper can be a P-channel transistor P3, which is configured with a source connected to the voltage source Vdd, a gate connected to the switch output terminal of the CMOS transmission gate 20, and a drain connected to the source of the P-channel transistor P0 in the inverter 10. The lower clamper can be an N-channel transistor N3 having a source connected to the ground node, a gate connected to the switch output terminal of the CMOS transmission gate 20, and a drain connected to the source of the N-channel transistor N3 in the inverter 10.

Prior to oscillation, both of the input terminal X1 and the output terminal X2 are biased at about Vdd/2 so that the transistors P3, N3, P0 and N0 are turned on. During the oscillation period, the potential at the input terminal X1 gradually decreases from Vdd/2, and the potential at the output terminal X2 gradually increases from Vdd/2 such that source-to-gate potential Vsg1 of the transistor P4 increases. when Vsg1 is greater than |Vtp|, the transistor P4 is turned on so that the transistors P3 and N3 can be controlled by the drain voltage of the transistor P4. When the potential at the output terminal X2 gradually increases to Vdd−|Vtp|, due to the conduction of the transistor P4 the transmission gate 20 provides a voltage of Vdd−|Vtp| to the gates of the transistors P3 and N3 so that the transistor P3 is turned off and transistor N3 is turned on. When the potential at the input terminal X1 gradually increases from logic low level , the gate-to-source potential of the transistor N0 gradually increases. When the gate-to-source potential of the transistor N0 is greater than threshold voltage Vtn, the transistor N0 is turned on and the potential at the output terminal X2 gradually decreases from logic high level. When the gate-to-source potential Vgs2 of the transistor N4 is greater than Vtn, the transistor N4 is turned on and the gate potential of the transistor N3 decreases in conjunction with that of the output terminal X2. When the potential at the output terminal X2 gradually decreases to Vtn, due to the conduction of the transistor N4 the transmission gate 20 provides a voltage of Vtn to the gate of the transistor N3 so as to turn off the transistor N3 and turn on the transistor P3.

With respect to the embodiment of FIG. 3, the voltage swing at the output terminal X2 is about Vdd−|Vtp|-Vtn and thus power dissipation can be reduced efficiently. Furthermore, because this embodiment makes use of the upper clamper and the lower clamper, both being non-diode-connected, the oscillator is operable at an operating voltage less than 1.8V. Moreover, the upper clamper, the lower clamper and the inverter can be adjusted in dimension to increase the potential difference between the nodes D and E and thus increases AC voltage gain.

This circuit has been experimentally evaluated and it can operate properly as the supply voltage is scaled below 1.8V.

Figure 4:
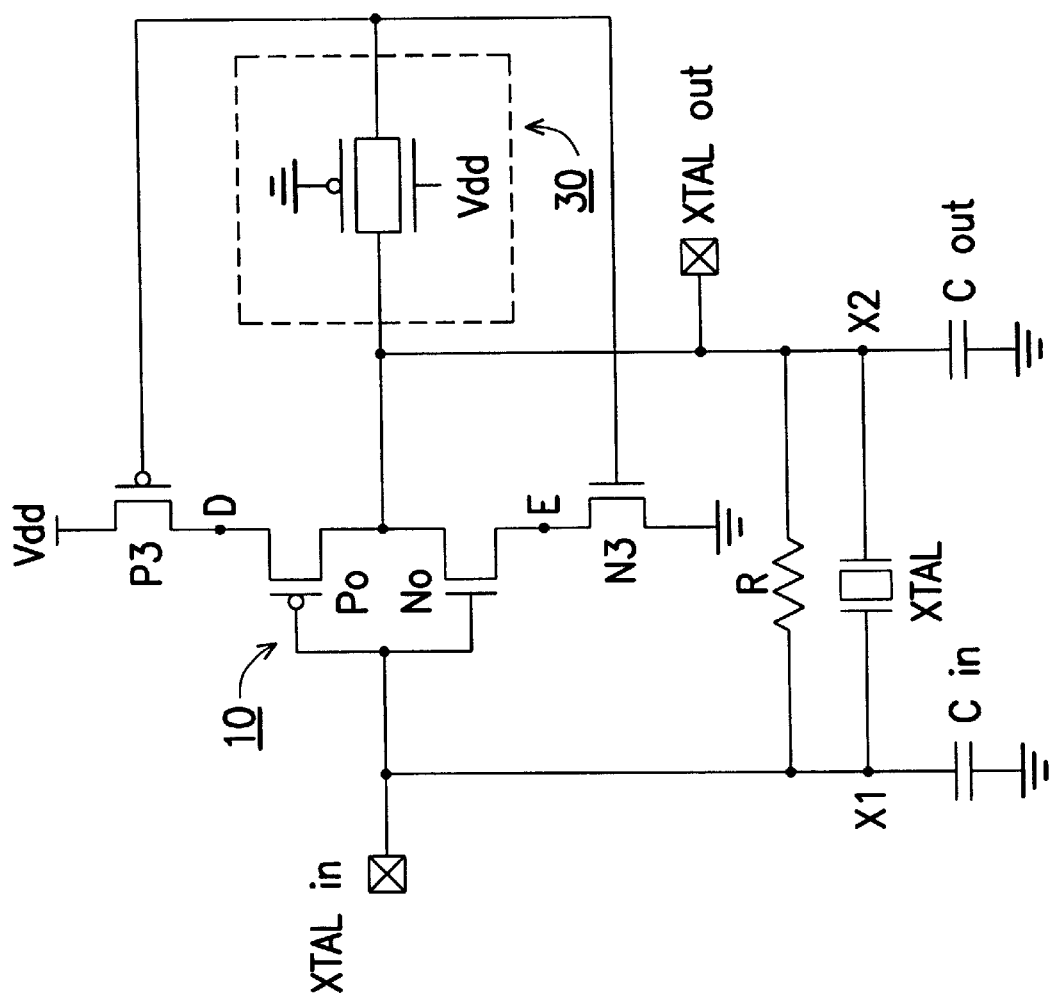
FIG. 4 schematically depicts the circuit diagram of a low voltage oscillator in accordance with the other preferred embodiment of the present invention.

Referring to FIG. 4, a circuit diagram of a lower voltage oscillator in accordance with the other preferred embodiment of the present invention is schematically illustrated.

The oscillator of this embodiment includes an inverter 10, a quartz crystal XTAL connected in parallel to the inverter 10, a voltage source Vdd, a ground node, an upper clamper, a lower clamper, and a delay device. For example, the delay device can be a resistor or a CMOS transmission gate 30 as shown in FIG. 4. The CMOS transmission gate 30 is provided with a pair of switch control terminals connected to voltage source Vdd and ground node, respectively. The CMOS transmission gate 30 has a delay input terminal connected to an output terminal X2 of the quartz crystal XTAL, and a delay output terminal connected to the upper clamper and the lower clamper. The upper damper can be a P-channel transistor P3, which is configured with a source connected to the voltage source Vdd, a gate connected to the delay output terminal of the CMOS transmission gate 30, and a drain connected to the source of the P-channel P0 in the inverter 10. The lower damper can be an N-channel transistor N3 having a source connected to the ground node, a gate connected to the delay output terminal of the CMOS transmission gate 30, and a drain connected to the source of the N-channel transistor N0 in the inverter 10. Thus, the potential at the delay output terminal is determined by that of the delay input terminal for controlling the transistors P3 and N3.

With respect to the embodiment of FIG. 4, the voltage swing at the output terminal X2 can be reduced to about Vdd−|Vtp|−−Vtn and thus power dissipation thereof can be efficiently reduced. Moreover, the upper clamper, the lower damper and the inverter can be adjusted in dimension to increase the potential difference between the nodes D and E and thus increases AC voltage gain.

Moreover, though both the upper damper and the lower damper are provided in the embodiments as shown in FIGS. 3 and 4, the oscillator only configured with either the upper damper or the lower damper can be applicable and operable.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An oscillator, comprising:
    an inverter and a quartz crystal connected in parallel, said quartz crystal having a crystal input and a crystal output;
    a voltage source;
    an upper clamper connected between said inverter and said voltage source;
    a ground node;
    a lower damper connected between said inverter and said ground node; and
    a feedback-controlled switch having a pair of switch control nodes connected to said crystal input, a switch input connected to said crystal output, and a switch output connected to said upper damper and said lower clamper, wherein a potential at said switch output is determined by voltage levels at said switch control nodes and said switch input in order to control said upper damper and said lower damper while oscillating.

2. The oscillator as claimed in claim 1, wherein said feedback-controlled switch is a CMOS transmission gate.

3. The oscillator as claimed in claim 1, wherein said upper clamper is a P-channel transistor configured with a source connected to said voltage source and a drain connected to said inverter.

4. The oscillator as claimed in claim 1, wherein said lower damper is an N-channel transistor configured with a source connected to said ground node and a drain connected to said inverter.

* * * * *